(12) United States Patent
Mihajlovic et al.

(10) Patent No.: US 11,004,489 B2
(45) Date of Patent: May 11, 2021

(54) PERPENDICULAR SPIN TRANSFER TORQUE MRAM MEMORY CELL WITH IN-STACK THERMAL BARRIERS

(71) Applicant: WESTERN DIGITAL TECHNOLOGIES, INC., San Jose, CA (US)

(72) Inventors: Goran Mihajlovic, San Jose, CA (US); Tiffany Santos, Palo Alto, CA (US); Michael Grobis, Campbell, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/459,369

(22) Filed: Jul. 1, 2019

(65) Prior Publication Data

US 2020/0402559 A1  Dec. 24, 2020

Related U.S. Application Data

(60) Provisional application No. 62/863,769, filed on Jun. 19, 2019.

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ............ G11C 11/1673; G11C 11/1675; G11C 11/161; H01L 43/02; H01L 43/08; H01L 43/10
See application file for complete search history.

(56) References Cited

U.S. PATENT DOCUMENTS 6,579,590 B2 * 6/2003 Ju ........................... C23C 14/06
428/336
7,411,817 B2 * 8/2008 Nozieres ................. G11C 11/16
365/158

(Continued)

FOREIGN PATENT DOCUMENTS

WO      2018004587      1/2018

OTHER PUBLICATIONS

PCT International Search Report dated Mar. 17, 2020, PCT Patent Application No. Mar. 17, 2020.
(Continued)

*Primary Examiner* — Toan K Le
(74) *Attorney, Agent, or Firm* — Vierra Magen Marcus LLP (57) ABSTRACT

A perpendicular spin transfer torque MRAM memory cell includes a magnetic tunnel junction stack comprising a pinned layer having a fixed direction of magnetization, a free layer having a direction of magnetization that can be switched, a tunnel barrier between the pinned layer and the free layer, a cap layer above the free layer and one or more in-stack multi-layer thermal barrier layers having multiple internal interfaces between materials. The thermal barrier layers have high enough thermal resistivity to maintain the heat generated in the memory cell and low enough electrical resistivity to not materially change the electrical resistance of the memory cell. One embodiment further includes a thermal barrier liner surrounding the free layer, pinned layer, tunnel barrier and cap layer.

15 Claims, 9 Drawing Sheets

(51) Int. Cl.
*H01L 43/10* (2006.01)
*H01L 43/02* (2006.01)
*H01L 43/08* (2006.01)

(52) U.S. Cl.
CPC .............. *H01L 43/02* (2013.01); *H01L 43/08* (2013.01); *H01L 43/10* (2013.01)

(56) References Cited

U.S. PATENT DOCUMENTS

| | | | |
|---|---|---|---|
| 7,863,598 B2 | 1/2011 | Sugita et al. | |
| 9,054,300 B2 | 6/2015 | Annunziata | |
| 9,917,247 B2 | 3/2018 | Annunziata | |
| 2007/0096162 A1 | 5/2007 | Happ et al. | |
| 2007/0263434 A1* | 11/2007 | Dieny | H01F 10/3254 365/171 |
| 2008/0137400 A1 | 6/2008 | Chen et al. | |
| 2011/0108937 A1* | 5/2011 | Reid | H01F 10/3254 257/421 |
| 2012/0008383 A1* | 1/2012 | Gapihan | B82Y 25/00 365/173 |
| 2012/0250178 A1* | 10/2012 | Hirano | G11B 5/66 360/59 |
| 2014/0356979 A1* | 12/2014 | Annunziata | H01L 43/12 438/3 |
| 2015/0179245 A1* | 6/2015 | Alvarez-Herault | G11C 11/16 365/158 |
| 2015/0295165 A1* | 10/2015 | Annunziata | H01L 43/08 257/421 |
| 2016/0126288 A1 | 5/2016 | Guo | |
| 2016/0155931 A1* | 6/2016 | Lee | H01L 43/08 257/421 |
| 2018/0096982 A1 | 4/2018 | Schafer | |

OTHER PUBLICATIONS

PCT Written Opinion of the International Searching Authority dated Mar. 17, 2020, PCT Patent Application No. Mar. 17, 2020.

Apalkov, et al., "Magnetoresistive Random Access Memory," Proceedings of the IEEE, Institute of Electrical and Electronics Engineers, Oct. 2016, 104, pp. 1796-1830. DOI: 10.1109/JPROC.2016. 2590142.

Lee, et al., "Anomalously low electronic thermal conductivity in metallic vanadium dioxide," Science Jan. 27, 2017: vol. 355, Issue 6323, pp. 371-374 DOI: 10.1126/science.aag0410.

Prejbeanu, et al., "Thermally assisted MRAMs: ultimate scalability and logic functionalities," Published Jan. 31, 2013 • 2013 IOP Publishing, Journal of Physics D: Applied Physics, vol. 46, No. 7 DOI: 10.1088/0022-3727/46/7/074002.

Pushp, et al., "Giant thermal spin-torque-assisted magnetic tunnel junction switching," Proceedings of the National Academy of Sciences of the USA. May 26, 2015; 112(21): 6585-6590 DOI: 10.1073/pnas.1507084112.

* cited by examiner

PERPENDICULAR SPIN TRANSFER TORQUE MRAM MEMORY CELL WITH IN-STACK THERMAL BARRIERS

This application claims priority to Provisional Application No. 62/863,769, filed on Jun. 19, 2019, titled "PERPENDICULAR SPIN TRANSFER TORQUE MRAM MEMORY CELL WITH IN-STACK THERMAL BARRIERS," which application is incorporated herein by reference in its entirety.

BACKGROUND

Memory is widely used in various electronic devices such as cellular telephones, digital cameras, personal digital assistants, medical electronics, mobile computing devices, non-mobile computing devices, and data servers. Memory may comprise non-volatile memory or volatile memory. A non-volatile memory allows information to be stored and retained even when the non-volatile memory is not connected to a source of power (e.g., a battery).

One example of a non-volatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Although MRAM is a promising technology, it has been challenging to achieve high bit density and high endurance for write operations with previous MRAM memory cell designs.

BRIEF DESCRIPTION OF THE DRAWINGS

Like-numbered elements refer to common components in the different figures.

DETAILED DESCRIPTION

A perpendicular spin transfer torque MRAM memory cell is proposed that includes a magnetic tunnel junction stack comprising a pinned layer having a fixed direction of magnetization that is perpendicular to a plane of the pinned layer, a free layer having a direction of magnetization that can be switched and is perpendicular to a plane of the free layer, a tunnel barrier between the pinned layer and the free layer, a cap layer above the free layer and one or more in-stack multi-layer thermal barriers having multiple internal interfaces between materials. The thermal barriers have high enough thermal resistivity to maintain the self-induced heat generated in the memory cell and low enough electrical resistivity to not materially change the electrical resistance of the memory cell (and, thus, not materially change an electrical current run through the memory cell). The plane of the free layer is parallel to the plane of the pinned layer. One embodiment further includes a thermal barrier liner surrounding at least a portion of magnetic tunnel junction stack. The thermal barrier liner has a higher electrical resistance than the in-stack multi-layer thermal barriers.

This proposed memory cell uses a lower write current and lower write voltage, which enables the use of smaller transistors so that a high bit density can be achieved. Additionally, the lower write voltage results in an increase in the difference between write voltage and breakdown voltage, which improves endurance and reliability.

The proposed memory cell utilizes spin transfer torque ("STT") to switch direction of magnetization of the free layer. STT is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (usually called the fixed, pinned or reference layer), a spin-polarized current can be produced. If this spin-polarized current is directed into a second magnetic layer (often referred to as the "free layer"), angular momentum can be transferred to this second magnetic layer, changing the direction of magnetization of the second magnetic layer. This is referred to as spin transfer torque.

Spin transfer torque can be used to program or write to MRAM memory. Spin transfer torque magnetic random access memory (STT MRAM) has the advantages of lower power consumption and better scalability over other MRAM which uses external magnetic fields to flip the active elements. Spin transfer torque technology has the potential to make possible MRAM devices combining low current requirements and reduced cost; however, the amount of current needed to reorient the magnetization can be too high for most commercial applications, which limits the number of bits that can be fabricated per chip area (i.e. the memory density). This is because a transistor that provides the current to the MRAM device has to be large and thus occupy large a footprint (current through the transistor scales with its size). Also, some STT MRAM has a small write margin. The write margin is the difference between the voltage or current that causes the breakdown of the MRAM device and voltage or current that is needed to reorient the magnetization (i.e. to write the bit). If this margin is small, the number of times that one can write into an MRAM bit before it breaks down, i.e. the MRAM endurance, is also small.

Figure 1:
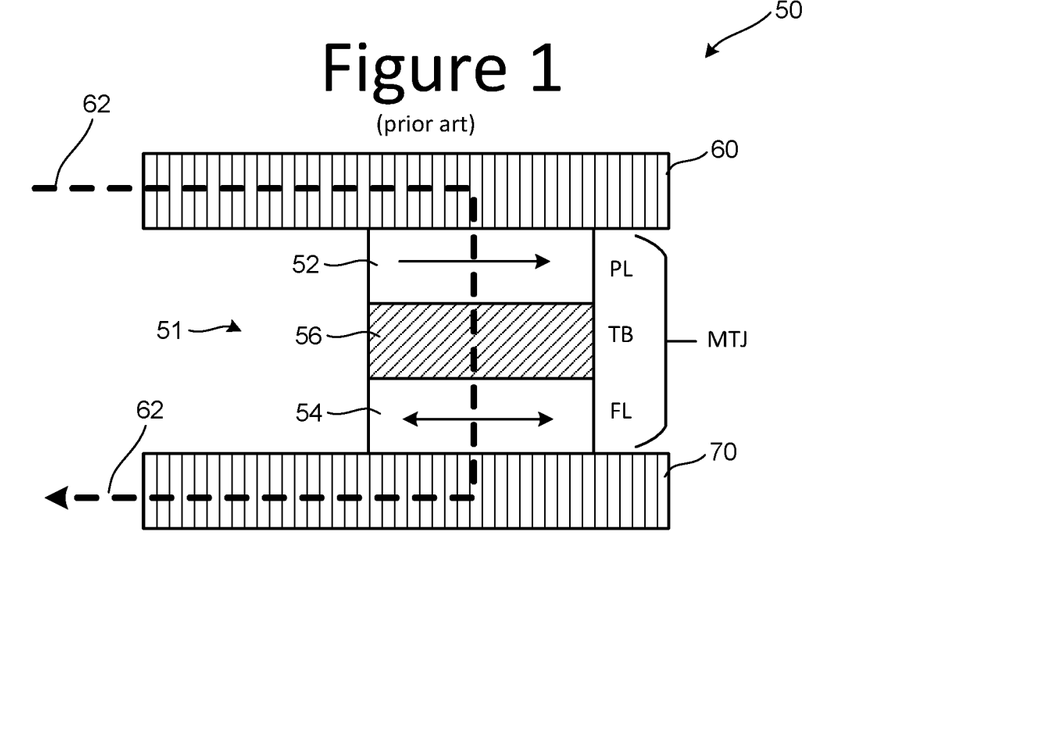
FIG. 1 is a block diagram of a MRAM memory cell.

FIG. 1 is a schematic representation of an example STT MRAM memory cell 50. For purposes of this document, a memory cell is the basic unit of storage. Memory cell 50 includes a magnetic tunnel junction (MTJ) 51 comprising an upper ferromagnetic layer 52, a lower ferromagnetic layer 54, and a tunnel barrier (TB) 56, which is an insulating layer between the two ferromagnetic layers. In this example, lower ferromagnetic layer 54 is the free layer (FL) and the direction of its magnetization can be switched. Upper ferromagnetic layer 52 is the pinned (or fixed) layer (PL) and its direction of magnetization cannot be changed (under normal circumstances). Pinned layer 52 is usually a synthetic antiferromagnetic layer which comprises several magnetic and non-magnetic layers, but for the purpose of this illustration it is depicted as a single layer 52 with fixed direction of magnetization. When the magnetization in free layer 54 is parallel to the magnetization in pinned layer PL 52, the resistance across the memory cell 50 is relatively low. When the magnetization in free layer FL 54 is antiparallel to the magnetization in pinned layer PL 52, the resistance across memory cell 50 is relatively high. The data ("0" or "1") in memory cell 50 is read by measuring the resistance of the memory cell 50. In this regard, electrical conductors 60/70 attached to memory cell 50 are utilized to read the MRAM data. By design, both the parallel and antiparallel configurations remain stable in the quiescent state and/or during a read operation (at sufficiently low read current).

In the remaining text and figures, direction of the write current is defined as the direction of the electron flow. Therefore, the term write current refers to an electron current. To "set" the MRAM memory cell bit value (i.e., choose the direction of the free layer magnetization), an electrical write current 62 is applied from conductor 60 to conductor 70. The electrons in the write current become spin-polarized as they pass through pinned layer 52 because pinned layer 52 is a ferromagnetic metal. While conduction electrons in a ferromagnetic metal will have spin orientation collinear with the direction of magnetization, a substantial majority of them will have a particular orientation that is parallel to the direction of magnetization, yielding a net spin polarized current. Electron spin refers to angular momentum, which is directly proportional to but antiparallel in direction to the magnetic moment of the electron, but this directional distinction will not be used going forward for ease of discussion. When the spin-polarized electrons tunnel across the tunnel barrier 56, conservation of angular momentum can result in the imparting of a torque on both free layer 54 and pinned layer 52, but this torque is inadequate (by design) to affect the magnetization direction of the pinned layer. Contrastingly, this torque is (by design) sufficient to switch the magnetization orientation in the free layer 54 to become parallel to that of the pinned layer 52 if the initial magnetization orientation of the free layer 54 was antiparallel to the pinned layer 52. The parallel magnetizations will then remain stable before and after such write current is turned off. In contrast, if free layer 54 and pinned layer 52 magnetizations are initially parallel, the free layer magnetization can be STT switched to become antiparallel to the pinned layer 52 by application of a write current of opposite direction to the aforementioned case. Thus, by way of the same STT physics, the direction of the magnetization of free layer 54 can be deterministically set into either of two stable orientations by judicious choice of the write current direction (polarity).

Figure 2:
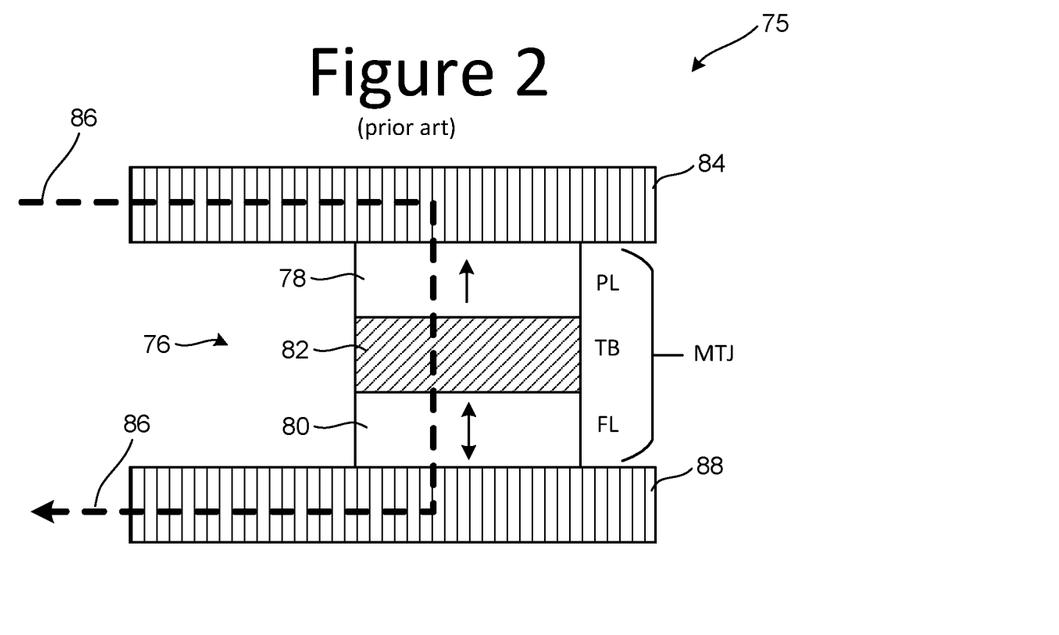
FIG. 2 is a block diagram of a MRAM memory cell.

The MRAM memory cell of FIG. 1 uses materials in which both the pinned and free layer magnetization are in the in-plane direction. In contrast, FIG. 2 depicts a schematic representation of a STT switching MRAM memory cell 75 in which both the pinned and free layer magnetization are in the perpendicular direction (i.e. perpendicular to the plane defined by the free layer and perpendicular to the plane defined by the pinned layer). Memory cell 75 includes a magnetic tunnel junction (MTJ) 76 comprising an upper ferromagnetic layer 78, a lower ferromagnetic layer 80, and a tunnel barrier (TB) 82 which is an insulating layer between the two ferromagnetic layers. In this example, lower ferromagnetic layer 80 is the free layer FL and the direction of its magnetization can be switched. Upper ferromagnetic layer 78 is the pinned (or fixed) layer PL and the direction of its magnetization is not changeable. When the magnetization in free layer 80 is parallel to the magnetization in pinned layer PL 78, the resistance across the memory cell 75 is relatively low. When the magnetization in free layer FL 80 is antiparallel to the magnetization in pinned layer PL 78, the resistance across memory cell 75 is relatively high. The data ("0" or "1") in memory cell 75 is read by measuring the resistance of the memory cell 75. In this regard, electrical conductors 84/88 attached to memory cell 75 are utilized to read the MRAM data. By design, both the parallel and antiparallel configurations remain stable in the quiescent state and/or during a read operation (at sufficiently low read current). To "set" the MRAM cell bit value (i.e., choose the direction of the free layer magnetization), an electrical write current 86 is applied from conductor 84 to conductor 88 and the memory cell operates as discussed above with respect to FIG. 1. Note that both free layer 80 and pinned layer 78 can comprise multitude of magnetic and non-magnetic layers but for the purpose of this illustration they are depicted here as single ferromagnetic layers having uniform magnetization direction.

Compared to the earliest MRAM cells which used magnetic fields from current carrying conductors proximate to the MRAM cell, the STT switching technique requires relatively low power, virtually eliminates the problem of adjacent bit disturbs, and has more favorable scaling for higher memory cell densities (reduced MRAM cell size). The latter issue also favors STT MRAM where the free and pinned layer magnetizations are orientated perpendicular to the film plane, rather than in-plane.

Figure 3:
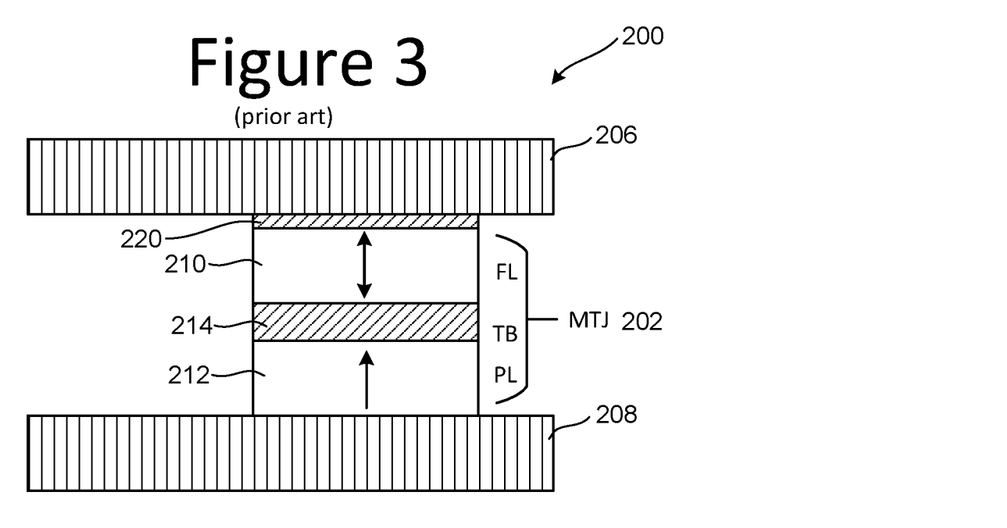
FIG. 3 is a block diagram of a MRAM memory cell.

FIG. 3 depicts a schematic representation of another example of a STT-switching MRAM memory cell 200 in which both the pinned and free layer magnetization are in the perpendicular direction. Memory cell 200 includes a magnetic tunnel junction (MTJ) 202 comprising an upper ferromagnetic layer 210, a lower ferromagnetic layer 212, and a tunnel barrier (TB) 214 serving as an insulating layer between the two ferromagnetic layers. In this example, upper ferromagnetic layer 210 is the free layer FL and the direction of its magnetization can be switched. Lower ferromagnetic layer 212 is the pinned (or fixed) layer PL and the direction of its magnetization cannot be changed. Both free layer 210 and pinned layer 212 can comprise multitude of magnetic and non-magnetic layers but for the purpose of this illustration they are depicted here as single ferromagnetic layers having uniform magnetization direction.

Memory cell 200 also includes a cap layer 220 that is adjacent to MTJ 202 (e.g., adjacent to free layer 210). Cap layer 220 is used in order to provide additional perpendicular anisotropy to the free layer 210. In the past, cap layer 220 has been implemented to be as thin as possible so that its resistance is negligible as compared to the resistance of the tunnel barrier 214, which dominates the resistance of the MRAM memory cell.

Figure 4:
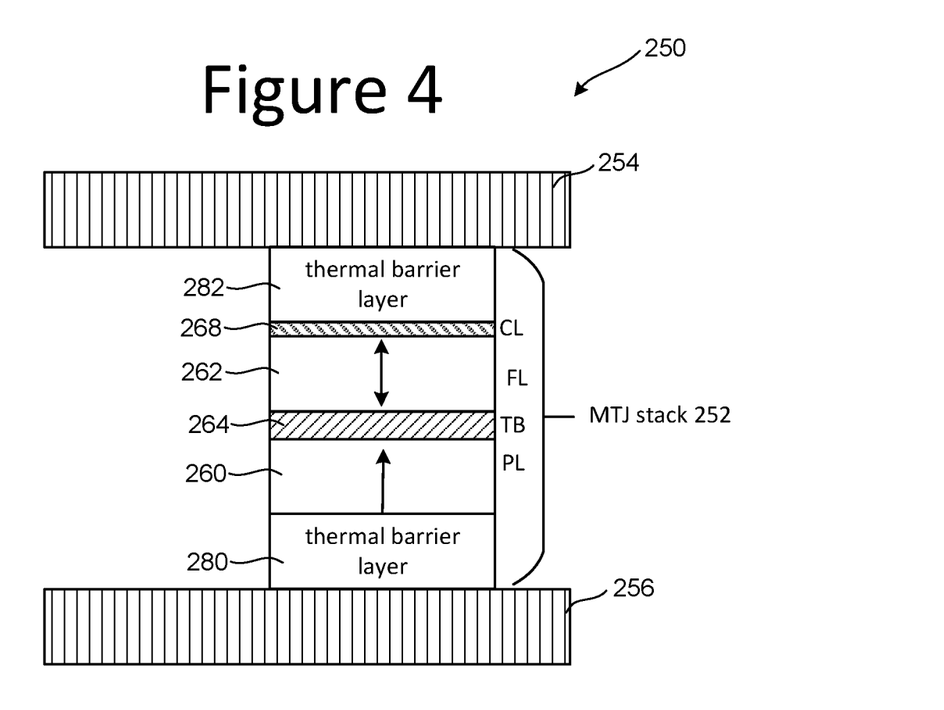
FIG. 4 is a block diagram of a MRAM memory cell.

The STT MRAM memory cells of FIGS. 1-3 require a larger write current to switch the direction of magnetization of the free layer. The larger write current necessitates the use of larger transistors and results in a decrease in the difference between write voltage and breakdown voltage. To remedy these issues, a new perpendicular MRAM memory cell 250 is depicted in FIG. 4. Memory cell 250 includes a magnetic tunnel junction stack 252 positioned between (and connected to) conductor 254 and conductor 256. In one embodiment, one of conductor 254 and conductor 256 is a bit line and the other is a word line. Magnetic tunnel junction stack 252 comprises a vertical stack of layers that includes pinned layer (PL) 260, free layer (FL) 262, a tunnel barrier (TB) 264 positioned between pinned layer 260 and free layer 262, and cap layer (CL) 268 positioned above free layer 262. At a first end (e.g., the bottom) of magnetic tunnel junction 252 is thermal barrier layer 280. At a second end (e.g., the top) of magnetic tunnel junction 252 is thermal barrier layer 282. Thermal barrier layer 280 is positioned between conductor 256 and pinned layer 260. Thermal barrier layer 282 is positioned between conductor 254 and cap layer 268. In one embodiment, pinned layer 260, free layer 262, tunnel barrier 264, cap layer 268, thermal barrier 280 and thermal barrier 282 are all "in-stack" meaning that they are all part of a single stack of materials.

Pinned layer 260 has a direction of magnetization that cannot be switched (fixed direction of magnetization) and is perpendicular to the plane of the pinned layer 260. Free layer 262 has a direction of magnetization that is perpendicular to the plane of free layer 262, and can be switched between parallel to the direction of magnetization of pinned layer 260 and anti-parallel to the direction of magnetization of pinned layer 260. In one embodiment, the plane of the free layer is parallel to the plane of the pinned layer. When the magnetization of free layer 262 is parallel to the magnetization of pinned layer 260, the resistance across the memory cell 250 is relatively low. When the magnetization of free layer 262 is anti-parallel to the magnetization of pinned layer 260, the resistance across memory cell 250 is relatively high. For example, low resistance can be data "0" and high resistance can be data "1," or vice versa. The data ("0" or "1") in memory cell 250 is read by measuring the resistance of the memory cell 250. In this regard, electrical conductors 254/256 (e.g., metal) attached to memory cell 250 are utilized to read the MRAM data. By design, both the parallel and antiparallel configurations remain stable in the quiescent state and/or during a read operation (at sufficiently low read current).

In one embodiment, tunnel barrier 264 is made of Magnesium Oxide (MgO); however, other materials can also be used. Free layer 262 is a ferromagnetic metal that possess the ability to change/switch its direction of magnetization. Multilayers based on transition metals like Co, Fe and their alloys can be used to form free layer 262. In one embodiment, free layer 262 comprises an alloy of Cobalt, Iron and Boron. Pinned layer 260 can be many different types of materials including (but not limited to) multiple layers of Cobalt and Platinum and/or an alloy of Cobalt and Iron. Cap layer 268 can be a thin oxide (e.g., MgO, $AlO_2$, $SiO_2$, $HfO_2$, GeO, SnO, SiC, SiN), amorphous semiconductor (e.g. Si, Ge, C, CN), or metal (e.g., Ru, Ir, Cu, Ta, W, Mo, Nb, Zr, Al, Hf, TiN, TaN).

Some challenges to developing memory systems that use STT MRAM include reducing the switching current and increasing the write margin. For example, switching from the state when the direction of magnetization of the free layer is parallel to the direction of magnetization of the pinned layer to the state when the direction of magnetization of the free layer is anti-parallel to the direction of magnetization of the pinned layer uses a larger write current. In general, it is desired to have a lower write current. The write current is the current applied to the memory cell to change the direction of magnetization of the free layer. There are at least two reasons for having a lower write current. First, some memory systems use a transistor (e.g., a NMOS transistor) to connect the word line (or other control line) to the memory cell. If the write current is high, a larger transistor is needed which results in less room available for memory cells and, thus, a lower density memory (equivalent to lower capacity for the given memory chip area). Second, using higher current will more quickly drain the batteries of mobile devices that include the memory system.

The write margin is defined as the difference between the write voltage (the voltage applied to the memory cell to change the direction of magnetization of the free layer) and the breakdown voltage for the memory cell. The greater the write margin, the higher is the endurance of the memory cell (i.e. the number of times that cell can be written into reliably).

According to the STT MRAM macrospin theory, the write voltage depends linearly on resistance area product ("RA") of the MRAM cell. For a given layer of material, RA is defined as:

$$RA = RP \times SA \qquad \text{Equation (0)}$$

where RP is the resistance of a layer of material to current applied in the perpendicular direction (orthogonal to the surface area) and SA is the surface area of that layer of material. The total RA for the memory cell is equal to the sum of RAs of all of its layers, including also the contribution from interfacial resistances between different layers. However, the RA of tunnel barrier and the RA of the cap layer (which are made of high resistivity insulating material) are so much larger than those of other layers and interfaces between them (which are made of low resistivity metals) that the latter can be neglected. However, the RA of the tunnel barrier itself depends on the relative magnetization orientations of pinned layer and free layer adjacent to it, as the conduction through the tunnel barrier occurs via spin polarized tunneling which is partially suppressed when magnetizations of the pinned layer and the free layer are oriented antiparallel to each other. By convention, RA of the tunnel barrier is defined for the case when magnetizations of the pinned layer and the free layer are oriented parallel to each other. Therefore, when a STT MRAM memory cell has a cap layer, the total RA for the memory cell is equal to the sum of RA of the tunnel barrier (defined for the parallel magnetization orientations of the pinned layer and the free layer) and the RA of the cap layer.

The external field $H_{SW}^{P \rightarrow AP}$ that is needed to be applied to a STT MRAM memory cell for switching the free layer from parallel to the pinned layer to anti-parallel to the pinned layer can be expressed as:

$$H_{SW}^{P \rightarrow AP} = H_{c0} + H_{RL} + \frac{\tau}{\alpha} \frac{V_b}{RA} + \in V_b - \varsigma \frac{V_b^2}{RA} \qquad \text{Equation (1)}$$

where:
- $H_{c0}$ is the coercivity of the free layer at room temperature without an applied voltage bias;
- $H_{RL}$ is the stray field from a pinned, i.e. reference layer (this is a constant);

$$\frac{\tau}{\alpha}$$

is a spin transfer torque coefficient;
$V_b$ is the voltage bias across the magnetic tunnel junction;
RA is resistive area product of the memory cell in the parallel state; and
∈ is a coefficient (constant).

$$\varsigma = (R_{th}A)\frac{dH_c}{dT} \quad \text{Equation (2)}$$

where:
$R_{th}$ is the thermal barrier resistance;
A is the area of the thermal barrier;
$H_c$ is the coercivity of the memory cell;
T is temperature; and $$\frac{dH_c}{dT}$$

is the change in coercivity per change in temperature (also known as temperature dependence of coercivity).

The external field $H_{SW}^{AP \to P}$ that is needed to be applied to a STT MRAM memory cell for switching the free layer from anti-parallel to the pinned layer to parallel to the pinned layer can be expressed as:

$$H_{SW}^{AP \to P} = -H_{c0} + H_{RL} + \frac{\tau}{\alpha}\frac{V_b}{RA} - \in V_b + \varsigma\frac{V_b^2}{RA'} \quad \text{Equation (3)}$$

$$\text{with } RA' = RA(1 + TMR|_{V_b=0})(1 - 0.5|V_b|) \quad \text{Equation (4)}$$

$$TMR|_{V_b=0} = \frac{R_{anti} - R_p}{R_p} \quad \text{Equation (5)}$$

where $R_{anti}$ is the resistance of the magnetic tunnel junction at zero voltage bias when the direction of magnetization of the free layer is anti-parallel to the direction of magnetization of the pinned layer and $R_p$ is the resistance of the magnetic tunnel junction at zero voltage bias when the direction of magnetization of the free layer is parallel to the direction of magnetization of the pinned layer. It is desired that TMR be sufficiently high to enable reliable reading.

Temperature can be expressed as:

$$T = T_0 + R_{th}AV_b^2/RA \quad \text{Equation (6)}$$

$$T = T_0 + (R_{th}A)(RA)J^2 \quad \text{Equation (7)}$$

where J is the current density through the memory cell.

In equations (1) and (3), the term $$\frac{\tau}{\alpha}\frac{V_b}{RA}$$

represents the effects of spin transfer torque and the term ∈ $V_b$ represents the effects of voltage controlled magnetic anisotropy. The terms $$\varsigma\frac{V_b^2}{RA} \text{ and } \varsigma\frac{V_b^2}{RA'}$$

represent the effects of self-heating (e.g., Joule heating). That is, the cap layer and the tunnel barrier are configured to generate heat in response to a current through the cap layer and the tunnel barrier. This heat is referred to as self-induced heat. As can be seen from equations (1) and (3), the self-heating assists in the switching of the direction of magnetization of the free layer.

Equations (1) and (3) are written in terms of the external field $H_{SW}^{P \to AP}$ or $H_{SW}^{AP \to P}$ that is needed to be applied to a STT MRAM memory cell for switching the free layer in response to a given voltage. However, to enable scaling and reliable operation, it is best to design a MRAM memory cell that does not need any external field to switch the direction of magnetization of the free layer. Thus, the voltage used to switch (referred to as $V_c$) is chosen by setting the values of external field $H_{SW}^{P \to AP}$ or $H_{SW}^{AP \to P}$ in equations (1) and (3) to 0 and solving for $V_b$ [$V_c = V_b$ when $H_{SW} = 0$]. It is desirable to lower $V_c$ because lowering $V_c$ creates a larger margin between $V_c$ and the breakdown voltage, which improves endurance and reliability. Equations (1) and (3) show that the voltage $V_c$ is strongly influenced by the self-heating effects. That is, an increase in the temperature due to self-heating assists the switching of the direction of magnetization of the free layer. The effects of self-heating can be exploited at lower $V_c$ by increasing resistive heating (e.g., increase RA), thermal barrier resistance area product ($R_{th}A$), or temperature dependence of coercivity $$\left(\frac{dH_c}{dT}\right).$$

The inventors have found that temperature in the memory cell can be increased more efficiently if the thermal barrier resistance $R_{th}$ is higher. The thermal barrier resistance $R_{th}$ is the thermal resistance of the thermal barrier (e.g., thermal barriers 280 and 282). The challenge, however, is to increase $R_{th}A$ without significantly increasing electrical resistance of the memory cell, which would result in a reduction in TMR. As per equation (5), a reduction in TMR would make it more difficult to read the state (0 versus 1, or Low Resistance versus high Resistance) of the memory cell.

Thus, it is proposed to engineer the thermal barriers that are in-stack (e.g., thermal barriers 280 and 282) to have high thermal resistivity (e.g., high $R_{th}$) so that they minimize heat loss in the memory cell (e.g., maintain the self-induced heat) and to have low electrical resistivity so that they do not materially change the electrical resistance of/through the magnetic tunnel junction (e.g., not materially change the electrical current through the magnetic tunnel junction). For purposes of this document, the term "materially change the electrical resistance or current" means to cause the electrical resistance to increase and the current to decrease by a magnitude sufficient to change behavior of the memory cell in a manner that can be measured and which changes TMR.

Examples of materials that can be used to fabricate thermal barrier layers 280 and 282 to have high enough thermal resistivity to maintain the self-induced heat and low enough electrical resistivity to not materially change the electrical current/resistance of the memory cell include metallic vanadium oxide $VO_2$; vanadium oxide doped with W (e.g., $W_xV_{1-x}O_2$); $V_{1-x}O_2$ doped with Cu, Au, Cr, or Ti; or niobium oxide $NbO_2$. Thermal barriers 280 and 282 can also be fabricated from ovonic threshold switches employing amorphous chalcogenide materials. The chalcogenide material may include S, Se, and/or Te alloyed with Si, Ge, Sn, P, As, and/or Sb, and may be doped with B, C, N, O, and/or In. Exemplary ovonic threshold switch materials include SiTe, SiAsTe, SiAsSe, AsSe, GeTe, GeSe, GeSeAs, GeSeTe, and GeSeTeAs, with atomic compositions for constituent elements ranging from 5 to 95%. Other materials for fabricating thermal barriers 280 and 282 include TiN; TaN; WN; C; CN; SiC; SiN; composites with graphene and nanoparticle fillers in electrically conducting states; thermoelectric materials such as SiGe, $Bi_2Te_3$, PbTe, $Mg_2Si$; and correlated electron materials such as $NbO_2$, $NiO_2$, VCrO and VTiO. Other materials can also be used that achieve high thermal resistivity and low electrical resistivity. In one embodiment, thermal barriers layers 280 and 282 are made of the same material. In another embodiment, thermal barrier layer 280 is made from different materials than thermal barrier layer 282.

Figure 5A:
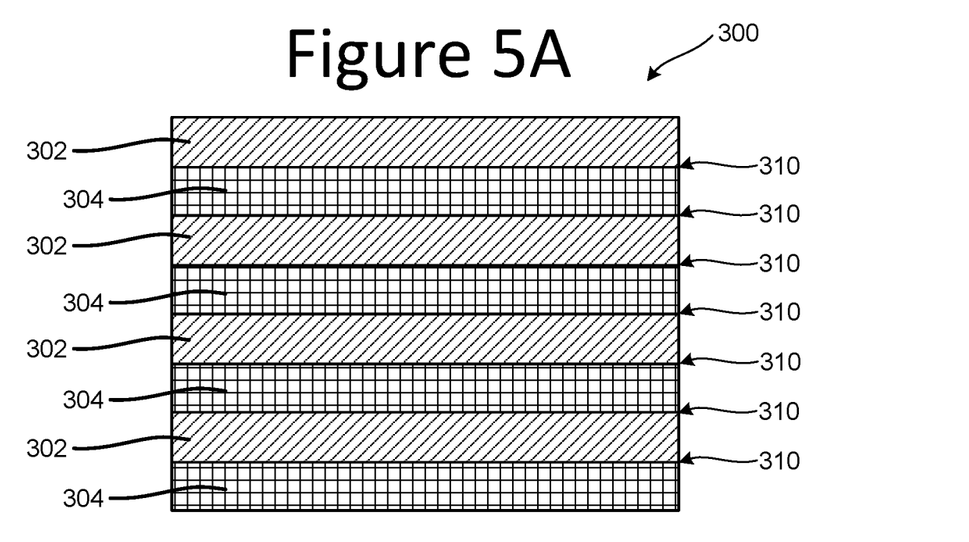
FIG. 5A is a block diagram of an in-stack multi-layer thermal barrier having multiple internal interfaces between materials.

In one set of embodiments, thermal barrier layers 280 and 282 are fabricated as multilayers. For example, FIG. 5A is a block diagram of in-stack multi-layer thermal barrier layer 300 including a plurality of layers 302 of a first material interleaved (i.e. alternating) with a plurality of layers 304 of as second material. Between each adjacent pair of layers 302/304 is an interface 310. In the example illustrated in FIG. 5A, there are four layers 302, four layers 304, and seven interfaces between layers 302 and 304. Although FIG. 5A shows four layers of each material, in other embodiments more or less than four layers of each material can be used. In one embodiment, there can be between 1 and 100 layers of each material. Each layer thicknesses can range from 0.1 nm to 10 nm. The resistance to heat flow originates from the materials themselves having low thermal conductivity and from the multiple internal interfaces between materials. The interfaces are "internal" because they are inside the thermal barrier 300 rather than on an external surface of thermal barrier 300. The materials used to fabricate the layers can include the materials discussed above. Having more layers creates more interfaces. Each interface adds thermal resistance, but not electrical resistance. So increasing the number of layers increases thermal resistivity without significantly increasing electrical resistivity.

In one embodiment, thermal barrier layer 300 comprises alternating layers of MgO and Ru, with the multiple internal interfaces between materials comprising the interfaces between layers of MgO and layers of Ru. For example, layers 302 can comprise MgO and layers 304 can comprise Ru. Other examples of materials include alternating layers of MgO and Ta, alternating layers of $VO_2$ and $Al_2O_3$, alternating layers of $VO_2$ and MgO, and alternating layers of TiN and MgO.

Thermal barrier 300 can be used to implement both of thermal barrier layers 280 and 282. Alternatively, thermal barrier layer 300 can be used to implement one of thermal barrier layers 280 and 282, such that thermal barrier layers 280 and 282 will be fabricated differently and will have different (or the same) thermal resistivity.

Figure 5B:
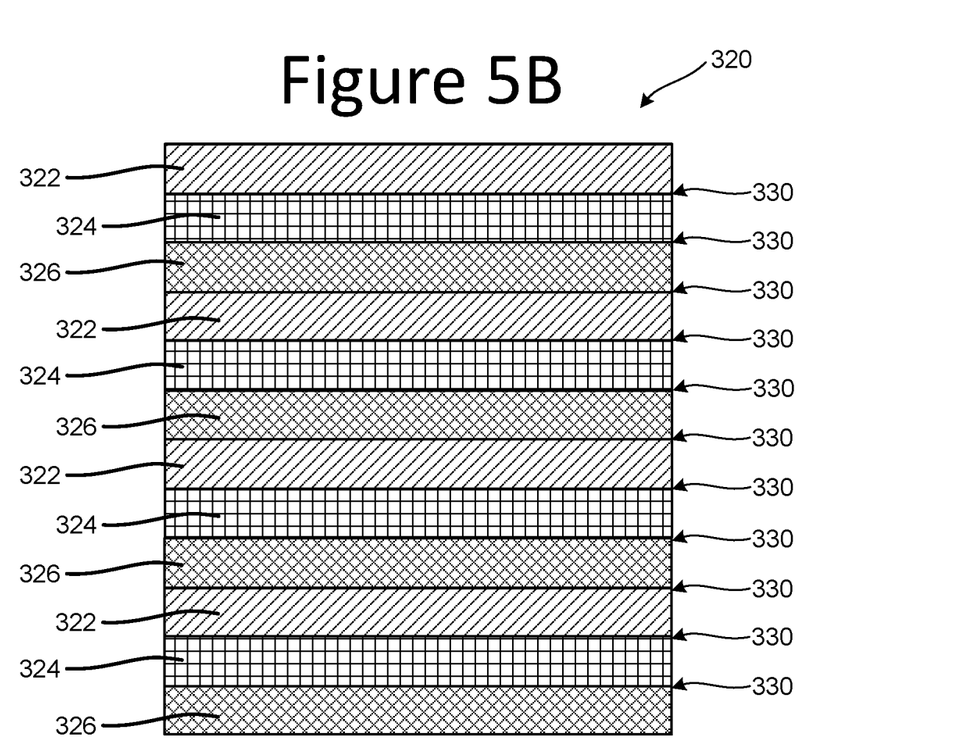
FIG. 5B is a block diagram of an in-stack multi-layer thermal barrier having multiple internal interfaces between materials.

Although FIG. 5A shows two types of layers being used for thermal barrier layer 300 (e.g., layers 302 and layers 304), in other embodiments, more than two types of layers can be used. For example, FIG. 5B is a block diagram of in-stack multi-layer thermal barrier layer 320 including a plurality of layers 322 of a first material interleaved with a plurality of layers 324 of a second material and a plurality of layers 326 of a third material. FIG. 5B also shows internal interfaces 330 between the various layers of different materials. Although FIG. 5B shows three layers of each material, more or less than three layers can be used. Thermal barrier 320 can be used to implement one or both of thermal barrier layers 280 and 282.

Figure 6A:
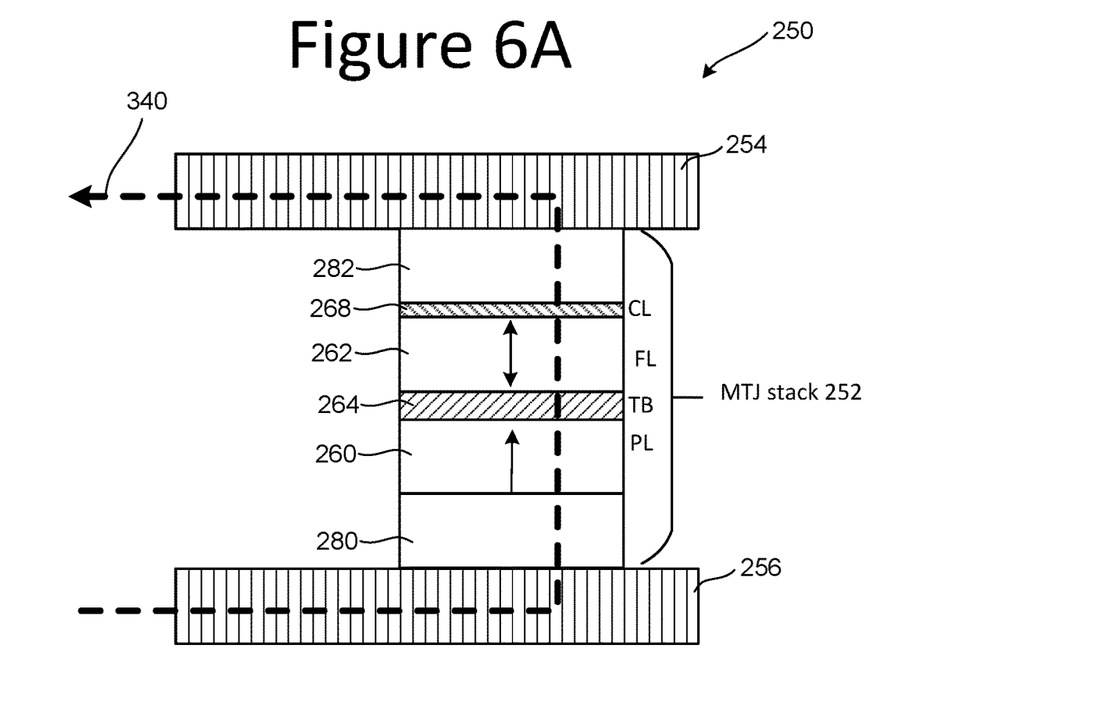
FIG. 6A is a block diagram of a MRAM memory cell.
Figure 6B:
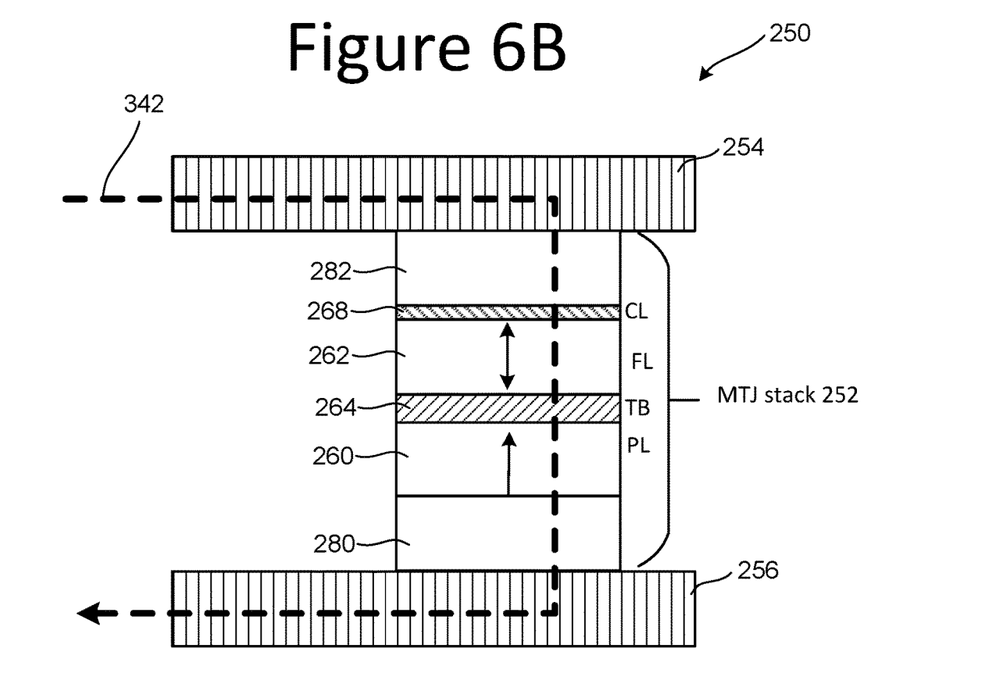
FIG. 6B is a block diagram of a MRAM memory cell.
Figure 6C:
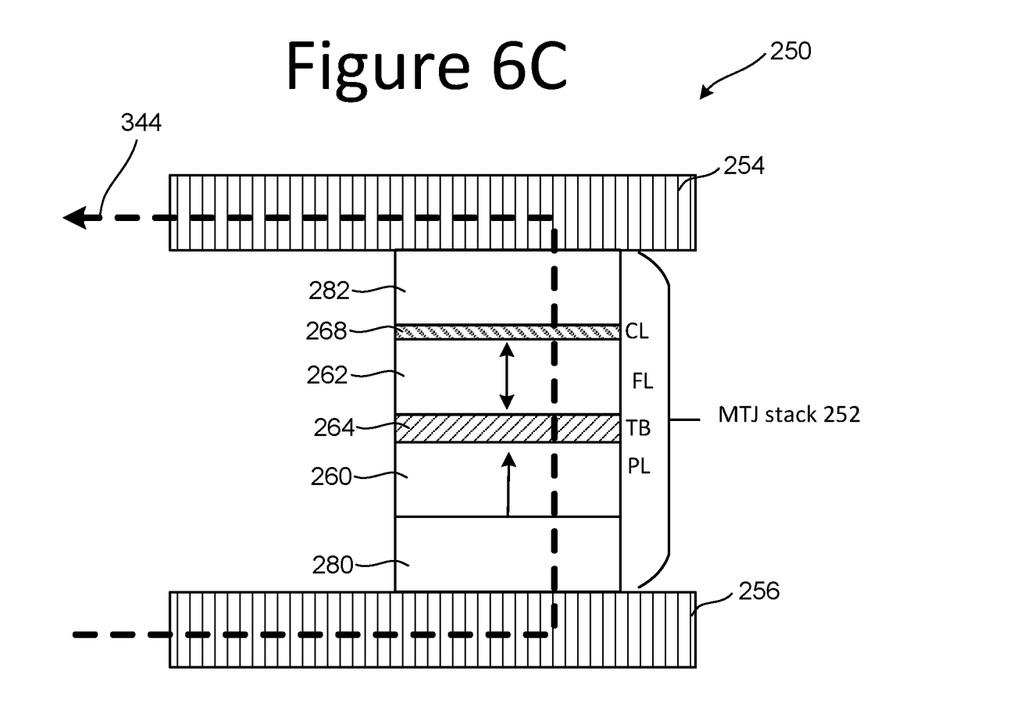
FIG. 6C is a block diagram of a MRAM memory cell.

FIGS. 6A-6C depict the above-described memory cell 250 during various memory operations. To "set" the MRAM memory cell bit value (i.e., choose the direction of the free layer magnetization), an electrical write current 340 is applied from conductor 256 to conductor 254, as depicted in FIG. 6A. The electrons in the write current 340 become spin-polarized as they pass through pinned layer 260 because pinned layer 260 is a ferromagnetic metal. When the spin-polarized electrons tunnel across tunnel barrier 264, conservation of angular momentum can result in the imparting of a spin transfer torque on free layer 262 and pinned layer 260, but this torque is inadequate (by design) to affect the magnetization direction of the pinned layer 260. Contrastingly, this spin transfer torque is (by design) sufficient to switch the magnetization orientation in the free layer 262 to become parallel to that of the pinned layer 260 if the initial magnetization orientation of the free layer 262 was antiparallel to the pinned layer 260. The parallel magnetizations will then remain stable before and after such write current is turned off. Note that write current 340 passes through thermal barrier layers 280 and 282.

In contrast, if first free layer 262 and pinned layer 260 magnetizations are initially parallel, the direction of magnetization of free layer 262 can be switched to become antiparallel to the pinned layer 260 by application of a write current of opposite direction to the aforementioned case. For example, write current 342 is applied from conductor 254 to conductor 256, as depicted in FIG. 6B. Thus, by way of the same STT physics, the direction of the magnetization of free layer 262 can be deterministically set into either of two stable orientations by judicious choice of the write current direction (polarity). Note that write current 342 passes through thermal barrier layers 280 and 282.

FIG. 6C depicts memory cell 250 during a reading operation. The data ("0" or "1") in memory cell 250 is read by measuring the resistance of the memory cell 250. Low resistance typically represents a "0" bit and high resistance typically represents a "1" bit. FIG. 6C shows a read current 344 being applied across the memory cell (e.g., across the magnetic tunnel junction stack 252) by applying the read current 344 from conductor 256 to conductor 254. Alternatively, the read current 344 can be applied from conductor 254 to conductor 256. Note that read current 344 passes through thermal barrier layers 280 and 282.

Figure 7A:
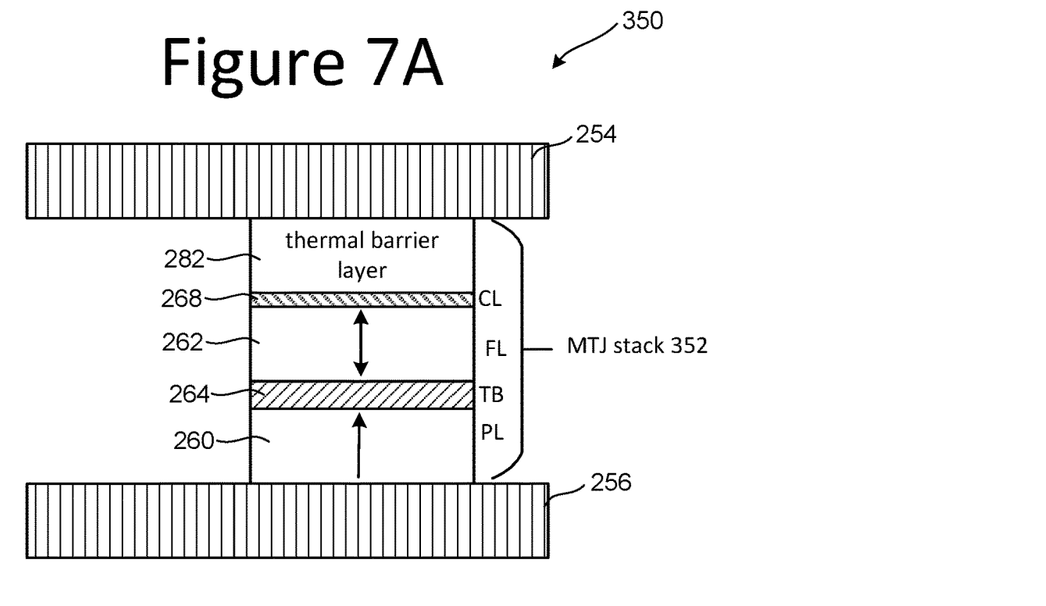
FIG. 7A is a block diagram of a MRAM memory cell.

FIG. 4 shows thermal barrier layers grown on the top and the bottom of the magnetic tunnel junction stack. However, in other embodiments the memory cell may have a thermal barrier layer only at the top of the magnetic tunnel junction stack or only at the bottom of the magnetic tunnel junction stack. For example, FIG. 7A depicts a perpendicular STT MRAM memory cell 350 that has a thermal barrier layer only at the top of the magnetic tunnel junction stack. Memory cell 350 includes a magnetic tunnel junction stack 352 positioned between conductor 254 and conductor 256. Magnetic tunnel junction stack 352 includes pinned layer 260, free layer 262, tunnel barrier 264 and cap layer 268. Magnetic tunnel junction stack 352 also includes thermal barrier layer 282 at the top of magnetic tunnel junction stack 352, but no thermal barrier layer at the bottom of the magnetic tunnel junction stack 352.

Figure 7B:
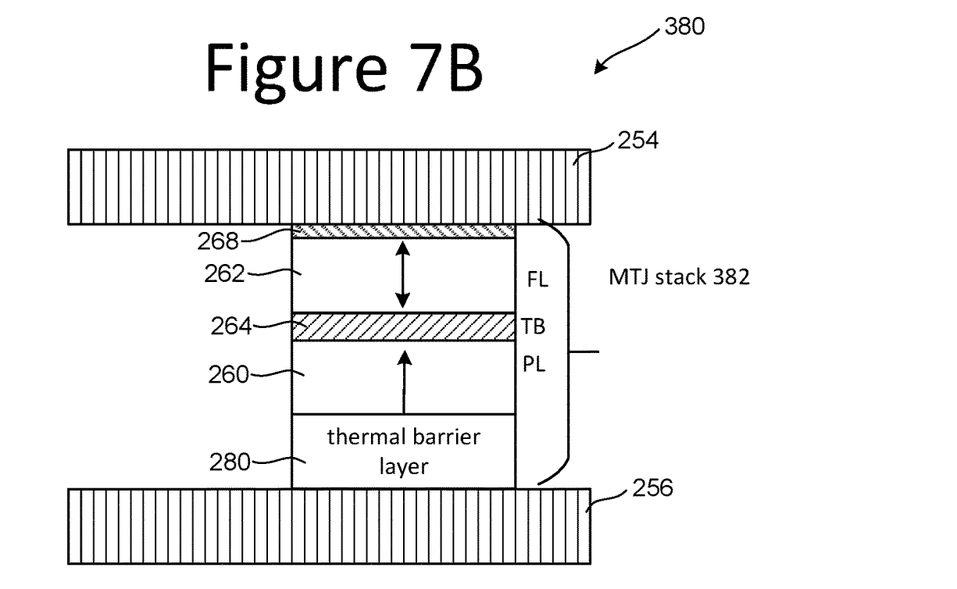
FIG. 7B is a block diagram of a MRAM memory cell.

As another example, FIG. 7B depicts a perpendicular STT MRAM memory cell 380 that has a thermal barrier layer only at the bottom of the magnetic tunnel junction stack. Memory cell 380 includes a magnetic tunnel junction stack 382 positioned between conductor 254 and conductor 256. Magnetic tunnel junction stack 382 includes pinned layer 260, free layer 262, tunnel barrier 264 and cap layer 268. Magnetic tunnel junction stack 382 also includes thermal barrier layer 280 at the bottom of magnetic tunnel junction stack 382, but no thermal barrier layer at the top of the magnetic tunnel junction stack 382.

When grown only at the top or the bottom of the magnetic tunnel junction stack, the thermal barrier layer is configured to generate a gradient of temperature across the magnetic tunnel junction in the perpendicular direction, as the self-induced heat can dissipate from one end of the magnetic tunnel junction but not from the other end. This gradient of temperature can generate thermal spin torque (TST) in addition to conventional STT generated by applying the electrical write current. Depending on the materials/interfaces, TST can either assist or oppose STT for the given thermal gradient. So it will reduce switching current for one polarity of switching (parallel to anti-parallel or anti-parallel to parallel) and increase it for the other polarity of switching. A gradient of temperature can also be useful in cases where memory cells with asymmetric amplitude of the write voltage for different switching polarities are required (e.g., 1T1R design with NMOS transistor).

Figure 8:
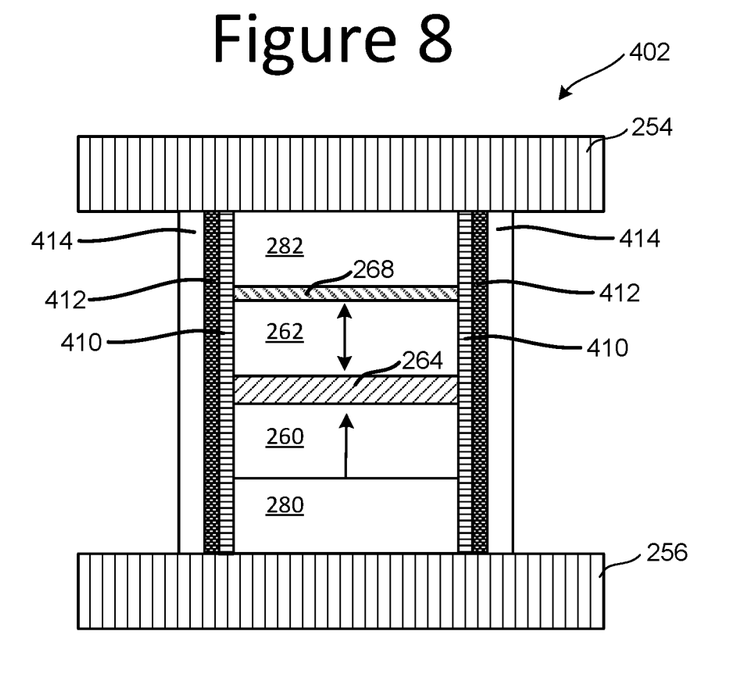
FIG. 8 is a block diagram of a MRAM memory cell.

FIG. 8 depicts another embodiment of a STT MRAM memory cell that includes additional structure for maintaining the self-induced heat. Memory cell 402 includes conductor 254, conductor 256, pinned layer 260, free layer 262, tunnel barrier 264, cap layer 268, thermal barrier layer 280 and thermal barrier layer 282, as discussed above. In one embodiment, conductors 254 and 256 can be heat sinks.

Memory cell 402 also includes a fill 410 surrounding the magnetic tunnel junction stack. In one embodiment, the magnetic tunnel junction stack (including layers 260, 262, 264, 268, 280 and 282) is circular such that the magnetic tunnel junction stack is in the shape of a cylinder and fill 410 surrounds the cylinder. In one embodiment, fill 410 comprises a dielectric material such as SiN, SiC, $TaO_2$, $SiO_2$ or $Al_2O_3$. Fill 410 serves to passivate the sidewalls (i.e. protect the magnetic tunnel junction without damaging it).

Memory cell 402 also includes thermal barrier liner 412 that surrounds fill 410; therefore, thermal barrier liner 412 surrounds the magnetic tunnel barrier stack. In one embodiment, thermal barrier liner 412 surrounds the entire magnetic tunnel barrier stack. In another embodiment, thermal barrier liner 412 surrounds a portion of the magnetic tunnel barrier stack (e.g., thermal barrier liner 412 surrounds at least cap layer 268, free layer 262 and tunnel barrier 264). Either way and even if the shape of the magnetic tunnel barrier stack is not cylindrical, thermal barrier liner 412 is positioned at the side of free layer 262, tunnel barrier 264 and cap layer 268. Thermal barrier liner 412 serves to confine/maintain the heat at free layer 262. Thus, thermal barrier liner 412 reduces or prevents lateral heat dissipation. Thermal barrier liner 412 can be made from chalcogenide materials composed of alloys of S, Se, and/or Te alloyed with Si, Ge, Sn, P, As, and/or Sb, and may be doped with B, C, N, O, and/or In. The chalcogenide materials can be layer to form multilayers of different alternating compositions. The multilayers can include repetitions of the same ovonic threshold switch material separated by a different ovonic threshold witch materials or different semiconducting or insulating material, such as Si, SiN, SiC, $TaO_2$, $SiO_2$ or $Al_2O_3$. The layer thicknesses can range from 0.1 nm to 10 nm. In order to reduce or prevent lateral heat dissipation from the magnetic tunnel junction stack, thermal barrier liner 412 has a high thermal resistivity. Unlike thermal barrier layers 280/282, thermal barrier liner 412 does not need to have an electrical current (e.g., write currents 340/342 or read current 344) pass through it. Rather, in some embodiments it is advantageous for thermal barrier liner 412 to prevent an electrical current from passing through it. Therefore, in some embodiments, thermal barrier liner 412 has a higher electrical resistance than the in-stack multi-layer thermal barrier layers 280/282.

Surrounding thermal barrier liner 412 is liner 414. Thus, thermal barrier liner 412 is positioned between fill 410 and liner 414. In one embodiment, liner 414 comprises dielectric materials such as SiN, SiC, $TaO_2$, $SiO_2$ or $Al_2O_3$.

Figure 9:
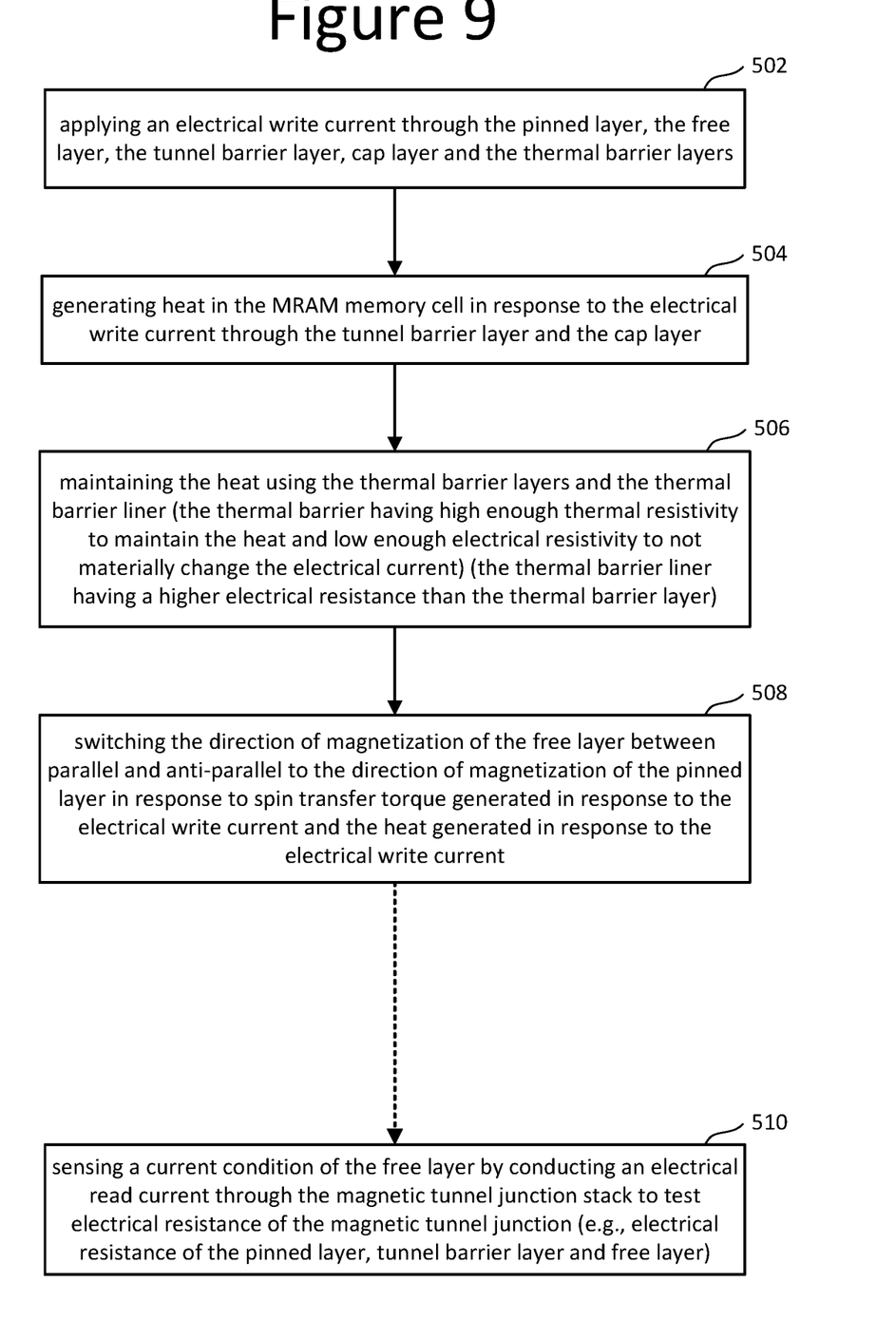
FIG. 9 is a flow chart describing one embodiment of a process for operating a MRAM memory cell.

FIG. 9 is a flow chart describing one embodiment of a process for operating the MRAM memory cells of FIGS. 4-8. Step 502 of FIG. 9 includes applying an electrical write current (e.g., 340 or 342) through the magnetic tunnel junction, including through pinned layer 260, free layer 262, tunnel barrier layer 264, cap layer 268 and the thermal barrier layers 280/282. Step 504 includes generating heat in the MRAM memory cell in response to the electrical write current through tunnel barrier layer 264 and cap layer 268. This is the self-induced heat described above, due to the current through cap layer 268 and tunnel barrier layer 264 (e.g., current 340 or current 342). In step 506, the heat generated in step 502 is maintained using the one or more thermal barrier layers 280/282 and thermal barrier liner 412 (in some embodiments only). Thermal barrier layers 280/282 have high enough thermal resistivity to maintain the heat and low enough electrical resistivity to not materially change the electrical current or resistance of the MTJ. Thermal barrier liner 412 has a higher electrical resistance than the thermal barrier layers 280/282. In one embodiment, thermal barrier liner 412 has high thermal resistivity and high electrical resistivity. Step 508 includes switching the direction of magnetization of the free layer between parallel and anti-parallel to the direction of magnetization of the pinned layer in response to spin transfer torque generated in response to the electrical write current and the heat generated in response to the electrical write current. In step 510, a read operation is performed that includes sensing a current condition of the free layer by conducting an electrical read current (e.g., read current 344 of FIG. 6C) through the magnetic tunnel junction stack to test electrical resistance of the magnetic tunnel junction stack (e.g., electrical resistance of the pinned layer, tunnel barrier layer and free layer). Step 510 is depicted further from step 508 and connected by a dashed line to indicate that read process can be performed much later in time (and not necessarily sequential) than the write process (e.g., step 502-508).

Figure 10:
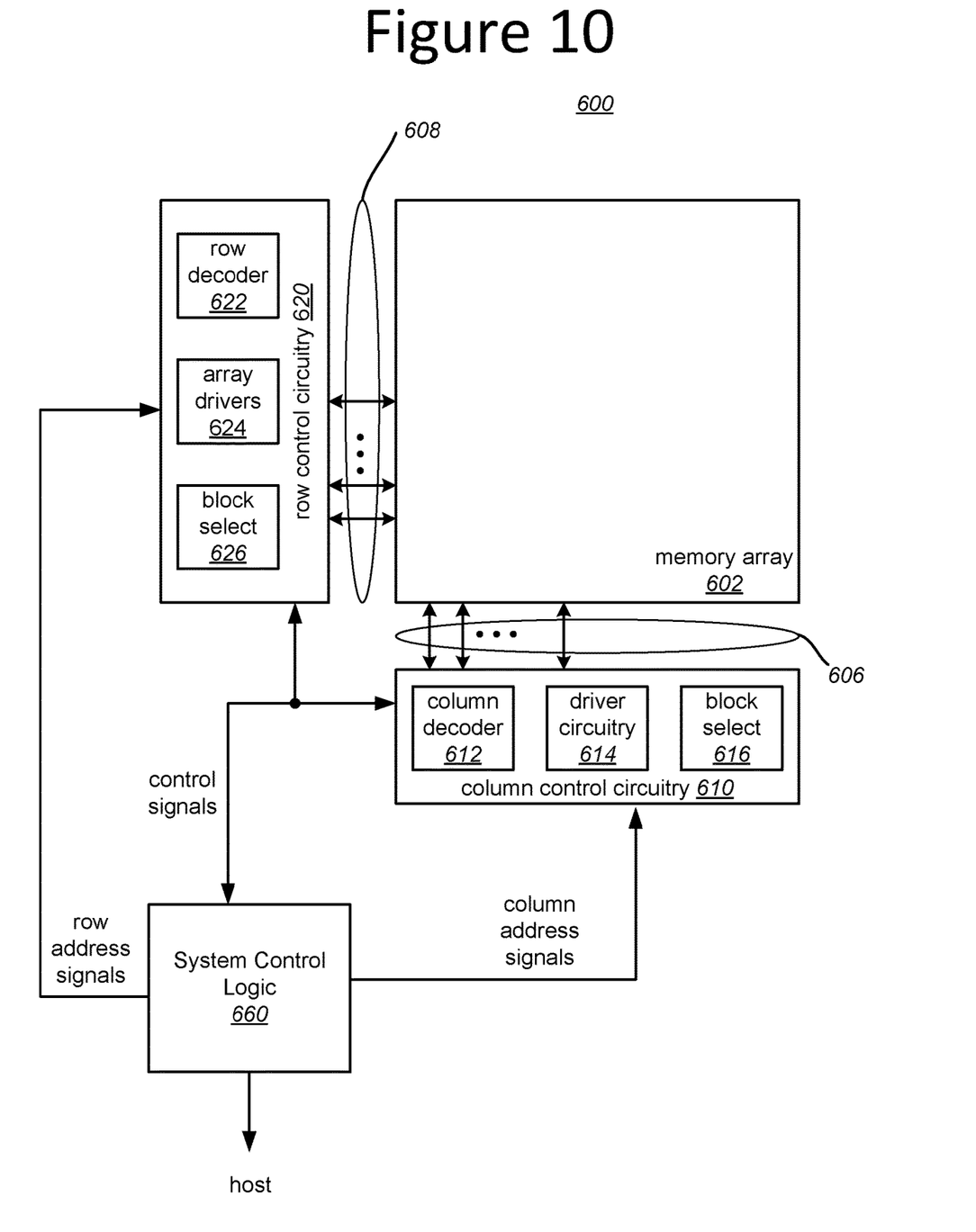
FIG. 10 is a block diagram of a memory system using the new memory cell proposed herein.

FIG. 10 is a block diagram that depicts one example of a memory system 600 that can implement the technology described herein, including performing the process of FIG. 9. Memory system 600 includes a memory array 602 that can include any of the memory cells described above including the memory cells depicted in FIG. 4-8. The array terminal lines of memory array 602 include the various layer(s) of word lines organized as rows, and the various layer(s) of bit lines organized as columns. However, other orientations can also be implemented. Memory system 600 includes row control circuitry 620, whose outputs 608 are connected to respective word lines of the memory array 602. Row control circuitry 620 receives a group of M row address signals and one or more various control signals from System Control Logic circuit 660, and typically may include such circuits as row decoders 622, array terminal drivers 624, and block select circuitry 626 for both reading and writing operations. Memory system 600 also includes column control circuitry 610 whose input/outputs 606 are connected to respective bit lines of the memory array 602. Column control circuitry 606 receives a group of N column address signals and one or more various control signals from System Control Logic 660, and typically may include such circuits as column decoders 612, array terminal receivers or drivers 614, block select circuitry 616, as well as read/write circuitry, and I/O multiplexers. System control logic 660 receives data and commands from a host and provides output data and status to the host. In other embodiments, system control logic 660 receives data and commands from a separate controller circuit and provides output data to that controller circuit, with the controller circuit communicating with the host. System control logic 660 may include one or more state machines, registers and other control logic for controlling the operation of memory system 600.

In one embodiment, all of the components depicted in FIG. 10 are arranged on a single integrated circuit. For example, system control logic 660, column control circuitry 610 and row control circuitry 620 are formed on the surface of a substrate and memory array 602 is formed on or above the substrate.

The above-described embodiments provide for a transfer torque MRAM memory cell has a lower switching current and an increased write margin due to self-heating. The lower current allows the memory cell to operate more efficiently, with less power and with smaller transistors (which enable an increase in density). Also, using a lower write current decreases device degradation over time. The increased write margin allows the memory cell to improve endurance and reliability.

The above-described embodiments of STT MRAM memory cells of FIGS. 4-8 have free layers with directions of magnetization that are perpendicular to the plane. This is a significant difference to memory cells that have free layers with directions of magnetization that are in-plane. For example, if a demagnetizing field for an in-plane STT MRAM memory cell is lowered, then switching current may also be lowered; however, a lower demagnetizing field in a perpendicular STT MRAM memory cell will cause the net perpendicular magnetic anisotropy of the memory cell to be higher and the switching current will therefore increase.

One embodiment includes a non-volatile memory apparatus comprising a magnetic tunnel junction stack. The magnetic tunnel junction stack includes a pinned layer having a fixed direction of magnetization that is perpendicular to a plane of the pinned layer, a free layer having a direction of magnetization that can be switched and is perpendicular to a plane of the free layer, and a first in-stack multi-layer thermal barrier having multiple internal interfaces between materials.

One embodiment includes a method of operating a MRAM memory cell. The MRAM memory cell includes a pinned layer and a free layer. The pinned layer has a fixed direction of magnetization that is perpendicular to a plane of the pinned layer. The free layer has a direction of magnetization that can be switched and is perpendicular to a plane of the free layer. The MRAM memory cell also includes a thermal barrier layer and a tunnel barrier layer. The tunnel barrier layer is positioned between the pinned layer and the free layer. The method comprises applying an electrical write current through the pinned layer, the free layer, the tunnel barrier layer and the thermal barrier layer; generating heat in the MRAM memory cell in response to the electrical write current through the tunnel barrier layer; maintaining the heat using the thermal barrier layer, the thermal barrier having high enough thermal resistivity to maintain the heat and low enough electrical resistivity to not materially change the electrical current; and switching the direction of magnetization of the free layer between parallel and antiparallel to the direction of magnetization of the pinned layer in response to spin transfer torque generated in response to the electrical write current and the heat generated in response to the electrical write current.

One embodiment includes a non-volatile memory apparatus comprising a pinned layer having a fixed direction of magnetization that is perpendicular to a plane of the pinned layer, a free layer having a direction of magnetization that can be switched using spin transfer torque and is perpendicular to a plane of the free layer, a first thermal barrier layer in line with the pinned layer and the free layer such that an electrical current can be applied through the first thermal barrier layer, the free layer and the pinned layer, and a thermal barrier liner surrounding the free layer. The thermal barrier liner has a higher electrical resistance than the first thermal barrier layer.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:
1. A non-volatile memory apparatus, comprising:
    a magnetic tunnel junction stack comprising:
        a pinned layer having a fixed direction of magnetization that is perpendicular to a plane of the pinned layer;
        a free layer having a direction of magnetization that can be switched and is perpendicular to a plane of the free layer;
        a first in-stack multi-layer thermal barrier having multiple internal interfaces between materials; and a thermal barrier liner positioned at a side of the free layer, the thermal barrier liner has a higher electrical resistance than the first in-stack multi-layer thermal barrier;

the pinned layer, the free layer and the first in-stack multi-layer thermal barrier form a single vertical stack of materials.

2. The non-volatile memory apparatus of claim 1, wherein:

the thermal barrier liner surrounds at least a portion of magnetic tunnel junction stack.

3. The non-volatile memory apparatus of claim 2, wherein the magnetic tunnel junction stack further comprises:

a tunnel barrier layer positioned between the pinned layer and the free layer; and an in-stack cap layer.

4. The non-volatile memory apparatus of claim 3, wherein:

the magnetic tunnel junction is configured such that a current applied through the the in-stack cap layer and the tunnel barrier layer creates heat in the magnetic tunnel junction stack; and the free layer is configured to switch direction of magnetization between parallel and anti-parallel to the direction of magnetization of the pinned layer in response to spin transfer torque generated in response to the electrical write current and the heat generated in response to the electrical write current.

5. The non-volatile memory apparatus of claim 1, wherein the magnetic tunnel junction stack further comprises:

a second in-stack multi-layer thermal barrier, the first in-stack multi-layer thermal barrier is positioned at a first end of the magnetic tunnel junction stack, the second in-stack multi-layer thermal barrier is positioned at a second end of the magnetic tunnel junction stack.

6. The non-volatile memory apparatus of claim 1, wherein:

the first in-stack multi-layer thermal barrier includes multiple layers of a first material interleaved with multiple layers of a second material.

7. The non-volatile memory apparatus of claim 1, wherein:

the first in-stack multi-layer thermal barrier comprises alternating layers of MgO and Ru; and the multiple internal interfaces between materials comprises interfaces between layers of MgO and layers of Ru.

8. The non-volatile memory apparatus of claim 1, wherein:

the first in-stack multi-layer thermal barrier comprises thermal switch material including one of vanadium oxide, niobium oxide or ovonic threshold switch material.

9. The non-volatile memory apparatus of claim 1, wherein:

the first in-stack multi-layer thermal barrier comprises one of alternating layers of MgO and Ru, alternating layers of MgO and Ta, alternating layers of $VO_2$ and $Al_2O_3$, alternating layers of $VO_2$ and MgO, and alternating layers of TiN and MgO.

10. The non-volatile memory apparatus of claim 1, wherein:

the first in-stack multi-layer thermal barrier is configured to generate a gradient of temperature across the magnetic tunnel junction stack in a direction perpendicular to the plane of the free layer, the plane of the free layer is parallel to the plane of the pinned layer, the gradient of temperature across the magnetic tunnel junction stack generates thermal spin torque on the free layer that is configured to assist the free layer to switch direction of magnetization.

11. A method of operating a MRAM memory cell, the MRAM memory cell includes a pinned layer and a free layer, the pinned layer has a fixed direction of magnetization that is perpendicular to a plane of the pinned layer, the free layer has a direction of magnetization that can be switched and is perpendicular to a plane of the free layer, the MRAM memory cell also includes a thermal barrier layer and a tunnel barrier layer, the tunnel barrier layer is positioned between the pinned layer and the free layer, the MRAM memory cell also includes a cap layer, the method comprising:

applying an electrical write current through the pinned layer, the free layer, the tunnel barrier layer, the cap layer and the thermal barrier layer;

generating heat in the MRAM memory cell in response to the electrical write current through the tunnel barrier layer and the cap layer;

maintaining the heat using the thermal barrier layer, the thermal barrier layer having high enough thermal resistivity to maintain the heat and low enough electrical resistivity to not materially change the electrical write current, the thermal barrier layer comprises multiple layers of materials with multiple internal interfaces between materials, the multiple interfaces create thermal resistance;

maintaining the heat using a thermal barrier liner surrounding at least the free layer, the thermal barrier liner having a higher electrical resistance than the thermal barrier layer; and switching the direction of magnetization of the free layer between parallel and anti-parallel to the direction of magnetization of the pinned layer in response to spin transfer torque generated in response to the electrical write current and the heat generated in response to the electrical write current.

12. The method of claim 11, further comprising:

applying an electrical read current through the pinned layer, the free layer, the tunnel barrier layer and the thermal barrier layer in order to test electrical resistance of the pinned layer, the free layer, and the tunnel barrier layer.

13. A non-volatile memory apparatus, comprising:

a pinned layer having a fixed direction of magnetization that is perpendicular to a plane of the pinned layer;

a free layer having a direction of magnetization that can be switched using spin transfer torque and is perpendicular to a plane of the free layer;

a first thermal barrier layer in line with the pinned layer and the free layer such that an electrical current can be applied through the first thermal barrier layer, the free layer and the pinned layer;

a cap layer positioned between the free layer and the first thermal barrier layer;

a second thermal barrier layer in line with the pinned layer and the free layer; and a thermal barrier liner surrounding the free layer, the thermal barrier liner has a higher electrical resistance than the first thermal barrier layer.

14. The non-volatile memory apparatus of claim 13, wherein:

the first thermal barrier layer comprises multiple layers of materials with multiple internal interfaces between the materials, the multiple interfaces create thermal resistance; and the second thermal barrier layer comprises multiple layers of materials with multiple internal interfaces between the materials, the multiple interfaces create thermal resistance.

15. The non-volatile memory apparatus of claim 14, wherein:

the free layer is configured to switch direction of magnetization between parallel and anti-parallel to the direction of magnetization of the pinned layer in response to spin transfer torque generated in response to the electrical current and the heat generated in response to the electrical current; and the heat is maintained by the first thermal barrier layer, the second thermal barrier layer and the thermal barrier liner.

* * * * *